United States Patent [19]

Butt et al.

[11] Patent Number: 4,767,049
[45] Date of Patent: Aug. 30, 1988

[54] SPECIAL SURFACES FOR WIRE BONDING

[75] Inventors: Sheldon H. Butt, Godfrey, Ill.; Julius C. Fister, Hamden; Jacob Crane, Woodbridge, both of Conn.

[73] Assignee: Olin Corporation, New Haven, Conn.

[21] Appl. No.: 864,662

[22] Filed: May 19, 1986

[51] Int. Cl.$^4$ .................... B23K 20/24; H01L 21/88
[52] U.S. Cl. .................... 228/111; 228/206; 228/179; 228/203; 428/612; 428/687
[58] Field of Search ............... 228/203, 206, 211, 111, 228/179; 156/655; 428/612, 687

[56] References Cited

U.S. PATENT DOCUMENTS

| | | | |
|---|---|---|---|
| 3,107,197 | 10/1963 | Stein et al. | 428/422 |
| 3,114,683 | 12/1963 | Chorney | 204/28 |
| 3,228,104 | 1/1966 | Emeis | 228/203 X |
| 3,537,175 | 10/1967 | St. Clair et al. | 357/70 X |
| 3,662,454 | 5/1972 | Miller | 228/111 |
| 3,684,464 | 8/1972 | Happ et al. | 428/614 |
| 3,875,652 | 4/1975 | Arnold et al. | 228/111 |
| 3,999,955 | 12/1976 | Martin et al. | 428/687 X |
| 4,027,326 | 5/1977 | Kummer et al. | 357/70 X |
| 4,358,479 | 11/1982 | Canestaro et al. | 427/98 |
| 4,500,605 | 2/1985 | Fister et al. | 428/469 |
| 4,552,627 | 11/1985 | Parthasarathi | 204/28 X |
| 4,566,939 | 1/1986 | Miller et al. | 156/655 |
| 4,661,417 | 4/1987 | Suzuki et al. | 428/612 X |

FOREIGN PATENT DOCUMENTS

| | | | |
|---|---|---|---|
| 3406542 | 8/1985 | Fed. Rep. of Germany | 228/179 |
| 1371510 | 7/1964 | France . | |
| 34678 | 3/1979 | Japan | 428/612 |
| 923777 | 5/1982 | U.S.S.R. | 228/203 |

Primary Examiner—Kenneth J. Ramsey
Attorney, Agent, or Firm—Gregory S. Rosenblatt; Paul Weinstein

[57] ABSTRACT

The present invention relates to a process for forming improved bonds between components of electrical or electronic devices. The process of the present invention preferably comprises annealing a metallic substrate to form a substantially uniform, substantially continuous oxide layer on a surface of the substrate, exposing the oxidized substrate to a reducing atmosphere so as to form an irregular surface on the substrate, and bonding another component to the irregular surface.

5 Claims, 1 Drawing Sheet

SPECIAL SURFACES FOR WIRE BONDING

The present invention relates to the manufacture of semiconductor packages and a technique for forming improved bonds between components thereof.

Copper and copper alloys are used in a variety of electrical and electronic applications such as electrical wires, printed circuit boards, and leadframe materials in semiconductor devices. In many of these applications, a copper or copper alloy component is bonded to another material. For example, in the manufacture of printed circuits, copper or copper alloy foil is bonded to a non-metallic substrate material such as a glass fiber reinforced epoxy, a phenolic laminated paper, a polyester film, or a polyimide film. Thereafter, the foil/substrate composite is subjected to an acid etching treatment to form a desired circuit. One of the major problems in the printed circuit area has been the poor adhesion properties between untreated copper or copper alloy foil and some non-metallic substrate materials. Consequently, considerable effort has been spent on the development of techniques for improving the adhesion or bond strength between copper or copper alloy foils and conventional substrate materials.

Early techniques for improving adhesion involved forming an adherent oxide layer on the foil surface to be bonded to the substrate material. The oxide layer was usually formed by treating the foil with an aqueous alkaline oxidizing solution. Both chemical and electrolytic treatments were used. U.S. Pat. Nos. 3,107,197 to Stein et al. and 3,114,683 to Chorney illustrate some of these early techniques. In French Patent Publication No. 1,371,510 to Rotschild Nominees Ltd., a technique is discussed in which a sheet of copper having an anodically produced adherent oxide coating is drawn through a NaOH bath and cathodically polarized to reduce the oxide coating to metallic copper. Prior to being laminated to a substrate material, a layer of tin or a tin alloy is deposited on the copper.

More recent techniques for improving adhesion between printed circuit foil and non-metallic substrates involve forming a plurality of dendritic structures on a surface of the printed circuit foil to be bonded to the substrate. The purpose of forming these dendritic structures is to increase the surface area of the foil and thereby improve the bond which is primarily mechanical in nature. In one such technique, a metal oxide layer is initially formed on a surface of the foil to be treated. Thereafter, the metal oxide layer is chemically converted into a fresh metal layer. The purpose of the fresh metal layer is to increase the number of dendritic structure sites by providing a fresh metal surface to which the dendrites can adhere. U.S. Pat. No. 4,552,627 to Parthasarathi illustrates this particular technique. In another technique, a plurality of dendrites are first formed on a surface of the foil. Thereafter, an oxidizing composition is applied to the treated foil surface to oxidize and further roughen the surface. U.S. Pat. No. 4,358,479 to Canestaro et al. illustrates this technique.

Recently, it has been suggested that conventional printed circuit boards can be replaced by a composite having a metal core, a metal-rich conductive layer and an aluminum oxide insulating layer intermediate the core and the conductive layer. In U.S. Pat. No. 4,500,605 to Fister et al., a technique for forming such a composite is illustrated. This technique comprises heating an alloy containing from about 0.5% to about 12% aluminum and having a matrix selected from a material of the group consisting of copper, iron, or nickel in an oxygen-rich atmosphere to form a material oxide-rich layer on a surface of the alloy. The alloy is then heated in a reducing atmosphere to reduce the material oxide-rich layer to an aluminum oxide layer on the surface of the alloy and a material-rich layer on the aluminum oxide layer.

Similar adhesion or bond strength problems have been encountered in other electrical and electronic applications for copper and copper alloy foil materials. For example, semiconductor packages generally contain a semiconductor device bonded to the leads of a leadframe by one or more leadwires. The leadframe and its leads are often formed from copper or copper alloy foil. The bonds between the copper or copper alloy leads and the leadwires have also been a source of considerable problems. Here too, a great deal of effort has been devoted to improving the quality of the bond formed between the copper or copper base alloy leads and the leadwires.

One approach for dealing with bonding and adhesion problems has been to form the leadframe from a composite strip material having a metal stripe inlayed into or plated onto a core material. The core material may comprise any suitable metallic substrate including but not limited to copper-base, iron-base, aluminum-base, or nickel-base materials. The metal stripe on the other hand is typically formed from a precious metal such as gold, palladium, or silver or from a non-precious metal such as aluminum or copper. The particular metal used as the stripe material is selected primarily on the basis that it be metallurgically compatible with whatever material is being used for the component or components to be bonded to the leadframe and/or its leads. This selection criteria is used in an attempt to minimize the formation of significant intermetallic compounds that degrade the quality of the bonds. The composite strip may be processed by any number of techniques into a leadframe having a desired lead count and pattern with the tip portion of each lead generally being formed from the stripe material. For some applications, the entire leadframe may be formed from the stripe material. In other approaches, the leadframe is initially formed from a metal or metal alloy such as copper or a copper base alloy, iron or an iron base alloy, aluminum or an aluminum base alloy, or nickel or a nickel base alloy. A portion of each leadframe lead is then plated with a metal such as gold, palladium, silver, aluminum, copper or alloys of these metals. U.S. Pat. Nos. 3,537,175 to St. Clair et al., 3,684,464 to Happ et al. and 4,027,326 to Kummer et al. illustrate some of these approaches. Needless to say, the cost of applying a precious metal plate or inlaying a metal stripe can be quite substantial. In some situations, it can equal the cost of forming the leadframe itself. Consequently, there are significant economic benefits to be gained by the elimination of the need to use a precious metal plate or a metal inlay.

Accordingly, it is an object of the present invention to provide a low cost process for improving the bonds between electrical or electronic device components.

It is a further object of the present invention to provide a process as above which does not require the use of precious metals to form a relatively strong bond.

It is a further object of the present invention to provide a process as above having particular utility in the manufacture of semiconductor or integrated circuit packages.

These and further objects and advantages will become more apparent from the following description and drawings in which like reference numerals depict like elements.

In accordance with the present invention, an improved bond is formed between two components by providing one of the components with a special bonding surface having a desired microtopography. The special surface comprises an irregular surface characterized by a number of promontories having a desired height or surface relief.

The special bonding surface of the present invention is preferably formed by subjecting a metallic component or substrate such as copper or copper alloy foil first to an oxidizing treatment and then to a reducing treatment. In accordance with the present invention, the oxidizing treatment forms a substantially uniform, substantially continuous metal oxide film having a desired thickness on at least one surface of the metal component or substrate. The subsequent reducing treatment has been found to reduce the metal oxide layer to a fresh metal layer having an irregular or roughened surface with a desired microtopography. It is believed that the irregular surface is the result of the reducing step causing a reduction in the volume of metal present on the substrate surface as compared to the volume of the oxide layer formed during the oxidizing treatment. It has further been discovered that by controlling the thickness of the metal oxide layer formed during the oxidizing treatment, one can obtain a desired surface relief for the irregular surface.

The oxidizing treatment may be performed in any number of ways. Preferably, it is performed by annealing the metallic component or substrate in an oxidizing atmosphere at a temperature and for a time sufficient to form an oxide layer having the desired thickness. The subsequent reducing step is preferably performed by exposing the oxidized substrate to a reducing atmosphere at a temperature and for a time sufficient to obtain the desired microtopography.

The technique of the present invention is believed to have particular utility in the manufacture of semiconductor or integrated circuit packages. For example, it may be used to improve the bond or bonds between a leadframe and/or its leads and one or more leadwires. In addition to improving the bond(s) between a leadframe and one or more leadwires, the technique of the present invention may be used to improve the adhesion between the leadframe and an encapsulating material. Still further, in those applications where a leadframe is to be bonded to a semiconductor device or die pads on the semiconductor device, the technique of the present invention may be used to improve the bond between the leadframe and the semiconductor device and/or the die pads.

In accordance with the present invention, a technique is described for promoting the development of improved bonds, particularly metallurgical bonds, between components of electrical or electronic devices. While there are many potential applications for the technique of the present invention, it is believed to have particular utility in the manufacture of semiconductor or integrated circuit packages.

Semiconductor packages usually have a semiconductor device or chip connected to a number of leadframe leads by a number of leadwires. The metallurgical bonds formed between the leads and their respective leadwires have been a continuing source of problems. The technique of the present invention is believed to overcome many of the prior problems. For example, the technique of the present invention promotes the development of stronger bonds between a leadwire and a lead by providing the lead with a non-directional surface that interacts substantially uniformly with the leadwire during wirebonding regardless of the orientation of the leadwire. In the past, the orientation of the leadwire has affected overall bond quality.

Figure 1:
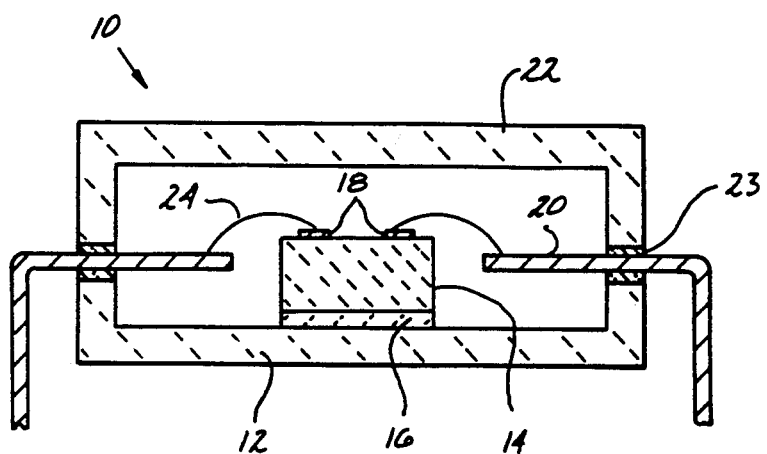
FIG. 1 is a cross sectional view of a semiconductor package.

Referring now to the figures, FIG. 1 illustrates a typical semiconductor package 10. The package 10 includes a base 12 and a semiconductor device 14 such as a semiconductor chip bonded thereto. The base 12 may be formed from any desired material. For example, it may be formed from a metallic material or from a non-metallic material such as a ceramic material or a plastic material. The semiconductor device 14 also may be formed from any suitable material but typically is formed from a silicon containing material. Any suitable material known in the art may be used to bond the device 14 to the base 12. For example, an adhesive such as an epoxy may be used to bond the device 14 to the base 12. Alternatively, a layer 16 of gold containing material may be used to bond the device 14 to the base 12. A layer of gold containing material is particularly useful as a bonding medium because it enables a relatively strong gold-silicon eutectic layer to be formed between the base 12 and a device 14 formed from a silicon containing material.

The device 14 may be provided with a number of bonding pads 18. Generally, the number of bonding pads 18 on a surface of the device will correspond to a desired number of interconnect leads 24. Similarly, the pattern of the bonding pads 18 on the surface of the device 14 will correspond to the pattern of the leads 18. The pads 18 are generally metallizations such as vapor deposited metal or metal alloy pads. In most modern semiconductor packages, the pads 18 are formed from aluminum or an aluminum alloy.

The package 10 further includes a plurality of leads 20 from a leadframe or some other type of connection system. The leads 20 and/or the leadframe generally extend through the package 10 for connecting the device 14 to an external circuit not shown such as a printed circuit. The leads 20 and the leadframe may be formed from any number of electrically conductive metals or metal alloys. Generally, the leads 20 are formed from a copper base alloy such as alloy C11000 or alloy C19400, although they may also be formed from iron base alloys such as iron-nickel alloys, nickel base alloys, silver containing copper alloys, and aluminum alloys. If desired, the leads 20 may be formed from a composite material such as an inlay or an onlay formed from similar or dissimilar metallic materials. The leads 20 and/or the leadframe may be bonded to the base 12, if desired, using any suitable material known in the art. For example, a sealing material 23 formed from a glass composition can be used to bond the leads 20 and/or the leadframe to the base 12. In addition to bonding the leads and/or the leadframe to the base, the glass sealing material 23 may be used to form a hermetic package structure.

To complete the package 10, a lid or cover 22 is bonded to the base 12. Again, a glass sealing material may be used to join the lid 22 to the base 12. In most modern packages, the lid 22 is formed from a non-metallic material such as a ceramic material. However, if desired, the lid 22 may be formed from a metal or a metal alloy. The package 10 shown in FIG. 1 may be formed using any suitable packaging fabrication technique known in the art.

In many semiconductor packages, the leadframe leads 20 are connected to the device 14 by a number of leadwires 24. The leadwires 24 are typically formed from gold or a gold containing material. If desired, aluminum or an aluminum base alloy may be used in lieu of gold. In the past, it has been difficult to achieve and maintain relatively strong metallurgical bonds between the leadwires and the leadframe leads. This has been in part due to the formation of intermetallic compounds that quickly degrade overall bond quality. As a result, it has been necessary to either spot plate the leads with or form the leads from a precious metal to obtain suitable levels of bond strength. The need to use precious metals to obtain the desired bond strength levels renders the process very expensive. Consequently, it is highly desirable from an economic standpoint to be able to directly bond the leadwires to the leadframe leads without the use of any intermediate material. It is believed that the technique of the present invention and the special surfaces produced thereby permit such direct bonding of the leadwires to the leads.

Figure 2:
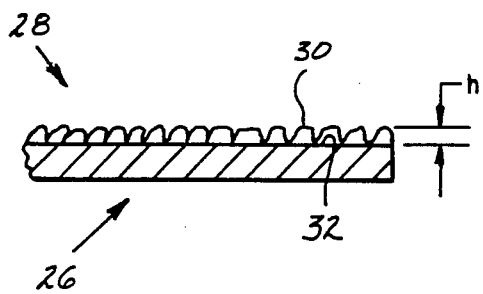
FIG. 2 is a cross sectional view of a metallic component having a special surface formed in accordance with the present invention.

The technique of the present invention promotes the development of stronger bonds by enabling one to form on a metallic substrate, such as that shown in FIG. 2, a special surface 28 that is substantially non-directional. As used herein, the term non-directional means that the surface interacts substantially uniformly with the component to which it is to be bonded. The ability to form such a surface is quite significant in improving the overall strength of the bond formed between the components. In addition to forming a nondirectional surface, the technique of the present invention promotes development of strong metalllurgical bonds by permitting a component such as a leadwire to be bonded to a relatively fresh metal surface.

Referring now to FIG. 2, the substrate 26 may comprise any metallic component such as a leadframe or a leadframe lead. The special surface 28 comprises an irregular or roughened surface characterized by a number of promontories 30 defining a desired surface microtopography. Each promontory 30 has a height "h" or topographical relief above the substrate surface 32. For most applications, it is desirable for the promontories to have a topographical relief in the range of from about $0.025\mu$ to about $2.5\mu$. Preferably, the topographical relief is in the range of from about $0.05\mu$ to about $0.5\mu$.

Figure 3:
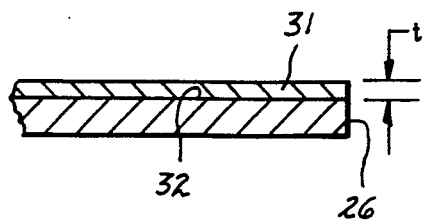
FIG. 3 is a cross sectional view of an intermediate step in the process of the present invention.

In accordance with the present invention, the surface 28 is formed by first exposing the substrate 26 to an oxidizing treatment and thereafter exposing the oxidized substrate to a reducing treatment. The purpose of the oxidizing treatment is to provide the metallic substrate 26 with a surface oxide layer having a desired volume of material. As shown in FIG. 3, the surface layer 31 having the desired volume of material comprises a substantially uniform, substantially continuous metal oxide layer 31 on the surface 32. The thickness "t" of the oxide layer 31 determines the volume of material added to the substrate 26.

The reducing treatment following the oxidizing treatment has been found to cause a reduction in the volume of material present on the surface 32. The result of reducing or shrinking the volume of material on the surface 32 is the formation of an irregular or roughened surface. By controlling the thickness "t" of the oxide layer 31 formed during the oxidizing treatment, one can control the microtopography of the irregular surface. More specifically, by creating an oxide layer having a desired thickness, one can ultimately create promontories 30 having a desired topographical relief. In addition to forming the special bonding surface of the present invention, the reducing step converts the surface layer 31 from an oxide layer to a fresh metal layer. This is an important aspect of the present invention in that it enables another component such as a leadwire to be bonded to a fresh metal layer—something that is quite desirable from the standpoint of forming strong metallurgical bonds.

The oxide layer 31 may be formed by annealing the substrate 26 in an oxidizing or oxygen-rich atmosphere for an appropriate time and at an appropriate temperature. Where the substrate 26 comprises a copper or copper alloy material such as a copper or copper alloy leadframe and/or leads, the substrate 26 may be annealed at a temperature of from about 200° C. to about 500° C., preferably from about 300° C. to about 400° C., for a time period in the range of from about 0.5 minutes to about 1000 hours, preferably from about 10 minutes to about 200 hours. The subsequent reducing step may be performed by placing the oxidized substrate in a heat source such as a furnace containing a reducing atmosphere at a temperature in the range of from about 200° C. to about 500° C., preferably from about 300° C. to about 400° C., for a time period in the range of from about 0.5 minutes to about 1000 hours, preferably from about 10 minutes to about 200 hours. Any suitable reducing gas atmosphere known in the art such as a 96% $N_2$-4% $H_2$ atmosphere may be used.

Of course, it should be recognized that the foregoing times and temperatures for both the oxidizing treatment and the reducing step are merely exemplary since these parameters are dependent upon the material being treated. Substrates formed from metals or metal alloys other than copper or a copper base alloy may require different temperatures and/or times.

Figure 4:
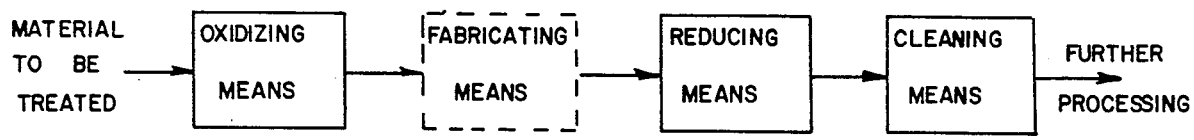
FIG. 4 is a schematic representation of a system employing the technique of the present invention.

Referring now to FIG. 4, a portion of a system 38 for forming a semiconductor package such as that shown in FIG. 1 is illustrated. The material or substrate to be treated may be provided to the system 38 in any desired form. For example, the material to be treated may comprise a strip of leadframes fabricated from a desired metal or metal alloy. Alternatively, the material being treated may comprise a metal or metal alloy strip at a desired finished gage which is later to be fabricated into a series of leadframes. Regardless of the state of the material, it is initially supplied to a means 40 for oxidizing at least one surface of the material. The particular oxidizing means 40 employed to form the surface layer 31 on the substrate of course depends upon the particular oxidation technique chosen to be performed. Preferably, the oxidizing means 40 comprises any suitable annealing apparatus known in the art such as an annealing furnace. As previously discussed, the substrate may be annealed in the furnace in an oxidizing or oxygen-rich atmosphere at a temperature in the aforementioned ranges for a time sufficient to form an oxide layer having a desired thickness.

Subsequent thereto, the oxidized substrate is transferred to a means 42 capable of converting the oxide layer 31 back into a fresh metal layer having the desired microtopography. The oxide layer conversion or reducing means 42 may comprise any suitable reducing means known in the art. Preferably, the reducing means comprises a furnace containing a reducing gas atmosphere. As previously discussed, the oxidized substrate may be heated to a temperature in the aforementioned temperature ranges for a time sufficient to convert the substantially uniform, substantially continuous oxide surface layer into a fresh metal layer having the desired microtopography. Where the substrate is formed from a copper or copper base alloy, the oxidizing treatment will form a copper oxide surface layer on the substrate and the reducing step will form an elemental copper roughened surface on the substrate.

While FIG. 4 shows the oxidizing and reducing steps as being performed in-line, it is within the scope of the present invention to perform these steps at different times with a significant interval of time between steps. For example, where a metal or metal alloy in strip form is supplied to the oxidizing means 40, it may be fabricated into a desired article between performance of the oxidizing and reducing steps. For example, the oxidized strip material may be passed to a fabricating means 46 such as a stamping apparatus for fabrication into a strip of leadframes prior to being transferred to the reducing means 42.

Alternatively, the oxidizing and reducing steps may be performed by passing the material to be treated through a furnace not shown having a plurality of containment zones. The first zone may contain an oxidizing or oxygen-rich atmosphere and the second zone may contain a reducing gas atmosphere.

After the special surface 28 of the present invention has been formed on the substrate 26, the treated substrate may be subjected to further processing. For example, if needed, the treated substrate may be cleaned. Cleaning may be performed where it is desirable to remove any organics formed on the surface 28 as the result of the absorption of organic species from the air or as residue from the lubricants used in mill and/or stamping operations incidental to the manufacture of the substrate. Any suitable means 44 known in the art may be used to clean the surface 28. For example, a laser such as a carbon dioxide laser may be used to clean the surface 28. If a laser is used, it is preferred to use one having a relatively long wavelength because such a laser substantially avoids heating the substrate 26 while heating and driving off the organic contamination. If cleanliness is not a requirement, then the cleaning means 44 may be omitted.

After cleaning, the treated substrate may be processed into a desired article. For example, where the treated substrate comprises a leadframe and/or leadframe leads, it may be joined to a base to which a semiconductor device is bonded. Thereafter, a number of leadwires may be joined to the leadframe and/or the leadframe leads. Any suitable technique known in the art including but not limited to thermocompression and thermosonic bonding may be used to bond the leadwires to the special bonding surface on the leadframe and/or the leads. As previously discussed, the special bonding surface formed by the technique of the present invention is particularly advantageous in bonding leadwires to leadframes and/or leads using conventional techniques such as thermosonic and thermocompression bonding. First, the special surface promotes the formation of relatively strong metallurgical bonds between leadframe leads and leadwires. This is because the special bonding surface of the present invention tends to be nondirectional which renders the orientation of the leadwire during bonding substantially less significant. Second, the special bonding surface eliminates the need to plate the leads with a precious metal prior to bonding. This results in a significant cost benefit.

Another benefit of the process of the present invention is that it lends itself to developing a surface microtopography that can be controlled over a substantial range by selecting and controlling the thickness of the oxide film layer 31. This is advantageous because there is a considerable variation in wire bonding parameters for different applications. For example, the temperature at which thermosonic bonding is performed may be as low as about 185° C. and as high as about 265° C. and the magnitude of applied ultrasonic energy may vary. The hardness of the leadwire may also vary from application to application.

In addition to the foregoing, the special bonding surface of the present invention provides other advantages. For example, in the case of semiconductor packages using copper or copper alloy leadframes, a silicon die not shown may be attached to the leadframe either by means of a brazement or a polymeric adhesive. Because the coefficient of thermal expansion of the silicon die is much lower than that of copper and typical copper alloys, substantial interfacial stresses may develop at the die bond as the assembly cools from the temperature of die bonding or during subsequent thermal cycling. On occasion, these stresses may be of such magnitude as to rupture the bond, breaking the attachment between the die and the leadframe. The surface microtopography generated by the process of the present invention provides a means for increasing the bond strength and minimizing the tendency for interfacial bond failure.

In plastic encapsulated semiconductor packages, the leadframe generally functions as the interconnection between the semiconductor or integrated circuit device and the circuitry external to the packaged device such as the circuitry on a surface of a printed circuit board. Inasmuch as the leadframe penetrates through an encapsulating material from a position quite close to the device, failure of the bond between the encapsulating material and the leadframe may provide an open channel through which water vapor and other undesirable ionic species may penetrate the package. This can lead to corrosion failure of the device by corrosion internal to the package. Thus, it is a further advantage of the present invention that it provides a surface microtopography which enhances the bond strength between the leadframe and the encapsulating material.

Although it is convenient to generate the oxide layer 31 by exposing the metal or metal alloy substrate to an oxidizing atmosphere at an appropriate temperature and for an appropriate time, the oxide layer may also be generated by immersing the metal or metal alloy substrate in an aqueous oxidizing reagent such as a potassium permanganate solution.

While it is preferred to form the special bonding surfaces of the present invention by subjecting a metal substrate to an oxidizing treatment and a subsequent reducing treatment, it is possible to form the special bonding surface by applying an etching reagent such as a ferric chloride type etchant to the metal or metal alloy substrate.

The technique of the present invention as discussed above generally forms a microtopography on a copper base material that is mechanically relatively soft. Depending upon the subsequent processing and/or upon the characteristics of the bonding wire and/or upon the wire bonding parameters used, a somewhat harder surface may be preferred. Such a surface may be generated by localized surface alloying of the microtopographic layer. For example, after the special surface has been formed, the metal or metal alloy component may be immersed in an electroless tin plating bath not shown so as to deposit a very thin layer of tin on top of the roughened surface. In forming the tin containing layer, the thickness of the tin containing layer should not be so great as to significantly smooth out the special surface. Suitable thicknesses for the plated tin layer are in the range of from about 10% to about 50% of the topographical relief of the special surface, preferably from about 10% to about 25% of the topographical relief. Either by extended storage at ambient temperatures or by exposure to elevated temperatures, up to about 300° C., the tin plating may be diffused into the copper surface generating a copper-tin alloy on the surface. Of course, the use of tin to form a harder surface is merely exemplary. Metals other than tin such as nickel, cadmium, zinc and/or cobalt may be deposited upon the surface.

While the present invention has been described in terms of forming a special surface on only one surface of the substrate, the technique described above may be used to form multiple roughened surfaces on a substrate.

The patents set forth in the specification are intended to be incorporated by reference herein.

It is apparent that there has been provided in accordance with this invention special surfaces for wirebonding which fully satisfy the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed:

1. A process for forming an improved electrical connection comprising:
   forming in situ a roughened substantially nondirectional surface having an irregular topography on a first copper base metal or metal alloy component by means of forming a metal oxide layer having a desired thickness on a surface of said first component by annealing said first component in an oxidizing atmosphere at a temperature in the range of from about 200° C. to about 500° C. for a time period in the range of from about 0.5 minutes to about 1000 hours; and
   reducing said metal oxide layer to a relatively fresh metal layer having said irregular topography by heating said first component with said oxide layer in a reducing atmosphere at a temperature in the range of from about 200° C. to about 500° C. for a time period in the range of from about 0.5 minutes to about 1000 hours; and
   bonding a second metallic component to said surface of said first component, whereby the non-directionality and the irregular topography of said surface promotes development of an improved metallurgical bond between said components.

2. The process of claim 1 further comprising:
   said temperature being in the range of from about 300° C. to about 400° C.; and
   said time period being in the range of from about 10 minutes to about 200 hours.

3. The process of claim 1 further comprising:
   cleaning said roughened surface using a laser beam to remove organics prior to said bonding step.

4. The process of claim 1 further comprising:
   said temperature being in the range from about 300° C. to about 400° C.; and
   said time period being in the range from about 10 minutes to 200 hours.

5. A process for forming an improved electrical interconnection comprising:
   forming a roughened surface having an irregular topography on a first metallic component;
   cleaning said surface;
   said cleaning step comprising using a laser beam to remove organics from said roughened surface; and
   bonding a second metallic component to said cleaned roughened surface on said first component,
   whereby the irregular topography of said roughened surface promotes development of an improved bond between said components.

* * * * *